United States Patent
Yuba et al.

(10) Patent No.: US 9,188,860 B2
(45) Date of Patent: Nov. 17, 2015

(54) METHOD FOR PRODUCING POLYAMIDE AND RESIN COMPOSITION

(75) Inventors: Tomoyuki Yuba, Shiga (JP); Masao Tomikawa, Shiga (JP)

(73) Assignee: TORAY INDUSTRIES, INC., Tokyo (JP)

(*) Notice: Subject to any disclaimer, the term of this patent is extended or adjusted under 35 U.S.C. 154(b) by 644 days.

(21) Appl. No.: 12/676,448

(22) PCT Filed: Sep. 4, 2008

(86) PCT No.: PCT/JP2008/065932
§ 371 (c)(1),
(2), (4) Date: Jul. 27, 2010

(87) PCT Pub. No.: WO2009/031602
PCT Pub. Date: Mar. 12, 2009

(65) Prior Publication Data
US 2010/0285404 A1 Nov. 11, 2010

(30) Foreign Application Priority Data
Sep. 6, 2007 (JP) ................................. 2007-231165

(51) Int. Cl.
G03F 7/004 (2006.01)
C08G 69/04 (2006.01)
C08L 77/00 (2006.01)
G03F 7/023 (2006.01)
C08G 69/00 (2006.01)
C08L 77/10 (2006.01)
C08G 77/00 (2006.01)
G03F 7/037 (2006.01)

(52) U.S. Cl.
CPC .............. *G03F 7/0233* (2013.01); *C08G 69/00* (2013.01); *C08L 77/10* (2013.01); *C08G 77/70* (2013.01); *G03F 7/037* (2013.01)

(58) Field of Classification Search
USPC .......................... 528/335, 336, 341, 346–348
See application file for complete search history.

(56) References Cited

U.S. PATENT DOCUMENTS 5,883,221 A * 3/1999 Sezi et al. .................. 528/327

FOREIGN PATENT DOCUMENTS

| EP | 0158726 | 10/1985 |
|---|---|---|
| EP | 0264678 | 4/1988 |
| EP | 0291779 | 11/1988 |
| JP | 10168173 A | 6/1998 |
| JP | 3167628 | 5/2001 |
| JP | 2002371133 A * | 12/2002 |
| JP | 2005-215436 A | 8/2005 |
| JP | 2006162791 A | 6/2006 |
| JP | 2007193322 A | 8/2007 |
| JP | 09183846 A | 2/2010 |

OTHER PUBLICATIONS

Machine-generated English-language translation of JP-2002371133, 11 pages, translation generated Jul. 2012.*
Hermanson (Bioconjugate Techniques, Academic Press, 1996, pp. 183-184).*
Journal of the chemical society of Japan, industrial chemistry section, 1969, vol. 1 72, No. 7, pp. 187-191.
International Search Report in related application PCT/JP2008/065932 mailed Nov. 4, 2008.

* cited by examiner

*Primary Examiner* — Rachel Kahn
(74) *Attorney, Agent, or Firm* — Pillsbury Winthrop Shaw Pittman LLP

(57) ABSTRACT

Disclosed is a method for producing polyamide, wherein a diimidazolide compound represented by the general formula (1) shown below is reacted with a diamine compound represented by the general formula (2) shown below. The present invention provides a method for producing a chlorine-free high molecular weight alkali-soluble polyamide by simple process.

[Chemical Formula 1]

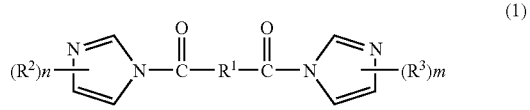

[Chemical Formula 2]

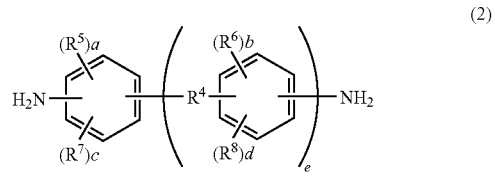

7 Claims, No Drawings

METHOD FOR PRODUCING POLYAMIDE AND RESIN COMPOSITION

CROSS REFERENCE TO RELATED APPLICATIONS

This application is a U.S. National phase of International Application No. PCT/JP2008/065932, filed Sep. 4, 2008, which in turn claims priority to Japanese Patent Application No. 2007-231165, filed on Sep. 6, 2007. The contents of which are incorporated herein by reference in its entirety.

TECHNICAL FIELD

The present invention relates to a method for producing polyamide, and a resin composition. More particularly, the present invention relates to a method for producing polyamide using a diimidazolide compound and a diamine compound, and a resin composition obtained by the same.

BACKGROUND ART

Polyamides have excellent mechanical strength. Of these polyamides, an aromatic polyamide is excellent in heat resistance and therefore it is expected to be developed into electronic material applications. When an NH group of an amide bond and a hydroxyl group, a thiol group or a carboxyl group are bonded to the aromatic ring at the ortho-position in the aromatic polyamide, heating causes intramolecular cyclization accompanied with elimination of water, resulting in conversion into a heterocyclic polymer having further excellent heat resistance. Recently, a positive photosensitive resin having excellent heat resistance has flourishingly developed utilizing such characteristics (see, for example, Patent Documents 1 to 3).

In use for the field of microelectronics, use of a chemical containing metal ions may exert an adverse influence on the electrical function of the device. Therefore, it is necessary that the polymer used in such applications is soluble in a metal ion-free developer.

As the method for producing an alkali-soluble polyamide, a method of reacting a dicarboxy dichloride with a proper diamine having an alkali-soluble group is known. A soluble base such as pyridine is usually added so as to trap hydrogen chloride generated during the reaction (see, for example, Patent Documents 4 to 5). Although a polymer soluble in a metal ion-free aqueous alkaline developer can be produced, chlorine ions are remained in the polymer. Since chlorine ions may cause corrosion to drastically damage the function of the device, chlorine ions must be removed by purification of the polymer using an ion exchanger.

As the method for producing a chlorine-free alkali-soluble polyamide, for example, there has been proposed a method of reacting a diamino compound having an alkali-soluble group with dicarboxylic acid in the presence of carbodiimide (see, for example, Patent Document 6). However, in the case of this reaction, a urea group remained by the rearrangement reaction of urea may exert an adverse influence on the quality of a heat-resistant layer to be finally formed. Also, the polymer produced by this method is not sufficiently soluble in the metal ion-free aqueous alkaline developer.

In order to solve these problems, a method for producing an alkali-soluble polyamide using various active dicarboxylic acid esters has been proposed (see, for example, Patent Documents 7 to 8). These active dicarboxylic acid esters enable removal of impurities that cause erratic behavior of the device, and suppression of deterioration of alkaline solubility. However, reprecipitation in a water/alcohol mixed solvent and washing with an alcohol after the polymerization were required so as to remove a by-product eliminated from active ester.

As the method for producing a high molecular weight aromatic polyamide, there has been proposed a diimidazole polycondensation reaction between diimidazolide of an aromatic dicarboxylic acid and an aromatic diamine (see, for example, Non-Patent Document 1). However, it was necessary to add a strong acid catalyst such as hydrochloric acid or Lewis acid because of an insufficient reaction rate in the absence of a catalyst.

[Patent Document 1] Japanese Unexamined Patent Publication (Kokai) No. 2005-215436
[Patent Document 2] Japanese Unexamined Patent Publication (Kokai) No. 2006-162791
[Patent Document 3] Japanese Unexamined Patent Publication (Kokai) No. 2007-193322
[Patent Document 4] EP 0 264 678 specification
[Patent Document 5] EP 0 291 779 specification
[Patent Document 6] EP 0 158 726 specification
[Patent Document 7] Japanese Patent No. 3,167,628 specification
[Patent Document 8] Japanese Patent No. 3,311,600 specification
[Non-Patent Document 1] "Journal of the Chemical Society of Japan, Industrial Chemistry Section", 1969, Vol. 72, No. 7, pp. 187-191

DISCLOSURE OF THE INVENTION

Problems to be Solved by the Invention

In light of these problems of the prior arts, an object of the present invention is to provide a method for producing a chlorine-free high molecular weight alkali-soluble polyamide by a simple process.

Means for Solving the Problems

That is, the present invention provides a method for producing polyamide, which comprises reacting a diimidazolide compound represented by the general formula (1) shown below with a diamine compound represented by the general formula (2) shown below:

[Chemical Formula 1]

$$(R^2)_n \underset{\underset{\phantom{x}}{\phantom{x}}}{\overset{N}{\underset{\phantom{x}}{\bigg\langle}}} N-\overset{O}{\underset{\|}{C}}-R^1-\overset{O}{\underset{\|}{C}}-N \underset{\phantom{x}}{\overset{N}{\underset{\phantom{x}}{\bigg\rangle}}} (R^3)_m \qquad (1)$$

wherein $R^1$ represents a divalent organic group having 6 or more carbon atoms, $R^2$ and $R^3$ represent a monovalent organic group having 1 to 3 carbon atoms, and n and m represent an integer of 0 to 2, and

[Chemical Formula 2]

$$H_2N \underset{(R^7)_c}{\overset{(R^5)_a}{\bigg\langle}} \left( R^4 \underset{(R^8)_d}{\overset{(R^6)_b}{\bigg\langle}} \right)_e NH_2 \qquad (2)$$

wherein $R^4$ represents a single bond, $SO_2$, an oxygen atom, a sulfur atom or a divalent organic group having 1 to 30 carbon atoms, $R^5$ and $R^6$ represent OH, SH, $SO_3H$ or COOH, $R^7$ and $R^8$ represent a monovalent organic group having 1 to 10 carbon atoms, a represents an integer of 1 to 3, b, c and d represent an integer of 0 to 3, and e represents an integer of 0 to 3.

Effects of the Invention

According to the present invention, it is possible to obtain a high molecular weight polyamide, which is chlorine free and is also soluble in an organic alkaline developer, by a simple process.

BEST MODE FOR CARRYING OUT THE INVENTION

The method for producing polyamide of the present invention is characterized by reacting a diimidazolide compound represented by the general formula (1) with a diamine compound represented by the general formula (2) shown below. By using a diimidazolide compound in which a leaving group is a water-soluble imidazole, the resultant polyimide can be reprecipitated and washed with water, and thus it is not necessary to use an organic solvent such as an alcohol. By using a diamine compound having at least one proton-donating functional group selected from OH, SH, $SO_3H$ and COOH in the molecule, these proton-donating functional groups play a role of an acid catalyst and a high molecular weight polyamide can be obtained without adding a strong acid catalyst such as hydrochloric acid or Lewis acid.

The diimidazolide compound used in the present invention has a structure represented by the following general formula (1).

[Chemical Formula 3]

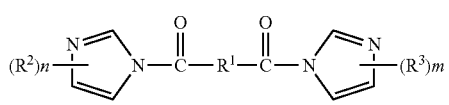

(1)

In the general formula (1), $R^1$ represents a divalent organic group having 6 or more carbon atoms. In view of heat resistance of the resultant polymer, $R^1$ preferably has one or more aromatic ring(s) and, more preferably, it has carbon atoms of 6 or more and 30 or less.

$R^2$ and $R^3$ represent a monovalent organic group having 1 to 3 carbon atoms. Specific examples thereof include a methyl group, an ethyl group and a propyl group. n and m represent an integer of 0 to 2. In view of high water solubility of a leaving group, it is preferred to have no substituent. Therefore, a compound represented by the following general formula (3) is preferred.

[Chemical Formula 4]

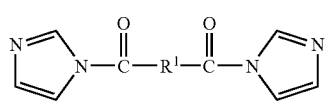

(3)

In the general formula (3), $R^1$ is the same as that in the general formula (1). Specific examples of the compound in which $R^1$ is a phenylene group include, but are not limited to compounds shown below. These compounds are used alone, or two or more kinds thereof are used in combination.

[Chemical Formula 5]

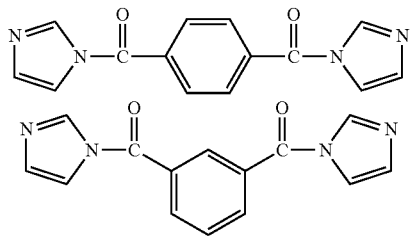

Furthermore, in view of obtaining a higher molecular weight polymer, $R^1$ preferably has two or more aromatic rings, and a compound represented by the following general formula (4) is preferred.

[Chemical Formula 6]

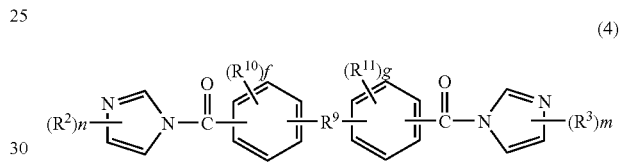

(4)

In the general formula (4), $R^9$ represents a single bond, $CH_2$, $SO_2$, an oxygen atom, a sulfur atom, $C(CH_3)_2$, $C(CF_3)_2$ or a residue of a fluorene structure. In view of improving exposure sensitivity of a photosensitive resin composition containing the resultant polymer, $R^9$ is more preferably a single bond, $SO_2$ or an oxygen atom, and still more preferably an oxygen atom. $R^{10}$ and $R^{11}$ represent OH, SH or a monovalent organic group having 1 to 10 carbon atoms. Examples of the monovalent organic group having 1 to 10 carbon atoms include a methyl group, an ethyl group and a propyl group. f and g represent an integer of 0 to 4. In view of heat resistance of the resultant polymer, it is preferred that f=g=0.

$R^2$ and $R^3$ represent a monovalent organic group having 1 to 3 carbon atoms. Examples of the monovalent organic group having 1 to 3 carbon atoms include a methyl group, an ethyl group and a propyl group. n and m represent an integer of 0 to 2. In view of high water solubility of a leaving group, it is preferred to have no substituent. Therefore, a compound represented by the following general formula (5) is preferred.

[Chemical Formula 7]

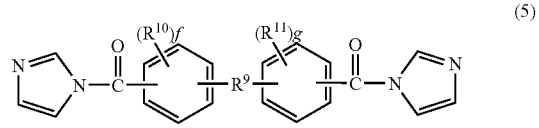

(5)

In the general formula (5), $R^9$, $R^{10}$, $R^{11}$, f and g are the same as those in the above general formula (4).

Specific examples of the compound represented by the general formula (5) include, but are not limited to compounds shown below. These compounds are used alone, or two or more kinds thereof are used in combination.

[Chemical Formula 8]

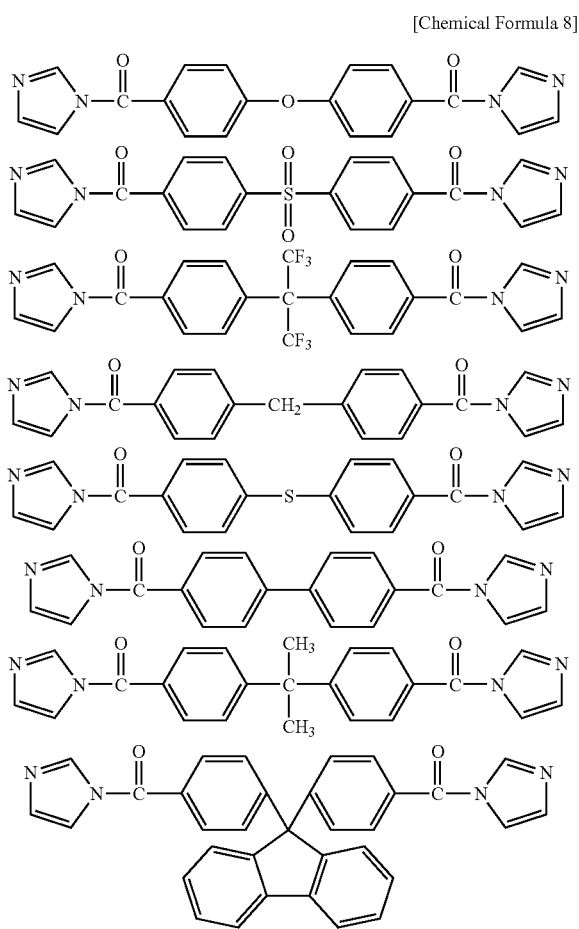

The diamine compound used in the present invention has a structure presented by the following general formula (2).

[Chemical Formula 9]

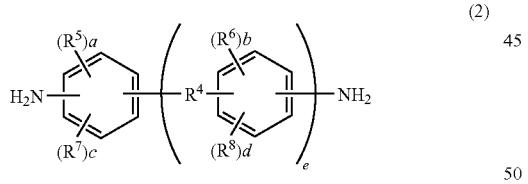

In the general formula (2), $R^4$ represents a single bond, $SO_2$, an oxygen atom, a sulfur atom or a divalent organic group having 1 to 30 carbon atoms. In view of obtaining a higher molecular weight polymer and improving exposure sensitivity of a photosensitive resin composition containing the resultant polymer, $R^4$ is preferably a single bond, $CH_2$, $SO_2$, an oxygen atom, a sulfur atom, $C(CH_3)_2$, $C(CF_3)_2$ or a residue of a fluorene structure, and more preferably $SO_2$ or $C(CF_3)_2$.

$R^5$ and $R^6$ represent OH, SH, $SO_3H$ or COOH. In view of obtaining a higher molecular weight polymer, $R^5$ and $R^6$ are more preferably OH or SH, and still more preferably OH. In the aromatic ring, OH, SH or COOH is preferably present at the ortho-position relative to an amino group since the catalytic effect is enhanced and a higher molecular weight polymer is obtained, and also exposure sensitivity of a positive photosensitive resin composition containing the polymer is improved.

$R^7$ and $R^8$ represent a monovalent organic group having 1 to 10 carbon atoms. In view of heat resistance of the resultant polymer, $R^7$ and $R^8$ are preferably monovalent organic groups having 1 to 5 carbon atoms, and more preferably monovalent organic groups having 1 to 3 carbon atoms. Specific examples thereof include a methyl group, an ethyl group and a propyl group.

In the general formula (2), a represents an integer of 1 to 3, and b, c and d each represents an integer of 0 to 3. In view of obtaining a higher molecular weight polymer, it is preferred that a=b=1. In view of heat resistance of the resultant polymer, it is preferred that c=d=0. e represents an integer of 0 to 3. In view of heat resistance of the resultant polymer and improving exposure sensitivity of a photosensitive resin composition containing the resultant polymer, it is preferred that e=1.

Specific examples of the diamine compound represented by the general formula (2) include, but are not limited to compounds shown below. These compounds are used alone, or two or more kinds thereof are used in combination.

[Chemical Formula 10]

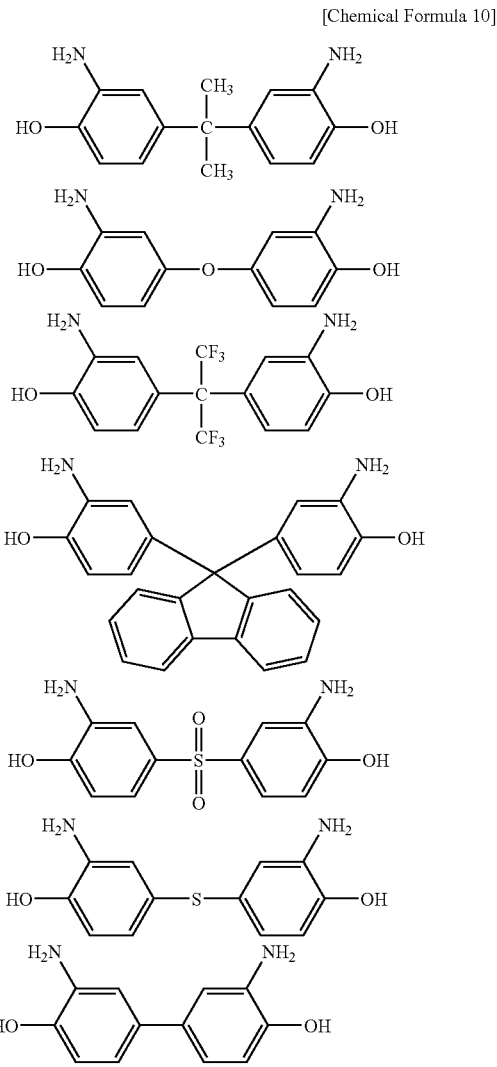

The method for producing polyamide using the above diimidazolide compound and diamine compound will be described below.

It is preferred that the diimidazolide compound and the diamine compound are dissolved in an organic solvent at room temperature, optionally an elevated temperature, and then polymerized by heating. In view of stability of the solution during the reaction, it is preferred that the diamine compound having higher solubility is dissolved first. Examples of the organic solvent include, but are not limited to, N-methylpyrrolidone, tetrahydrofuran, dimethyl sulfoxide, N,N-dimethylacetamide, γ-butyrolactone, propylene glycol monomethyl ether, propylene glycol monomethyl ether acetate and ethyl lactate.

In view of increasing the reaction rate, the temperature of the reaction between the diimidazolide compound and the diamine compound is preferably from 20 to 150° C., more preferably from 30 to 100° C., still more preferably from 45 to 85° C., and most preferably from 60 to 85° C.

In order to further increase the reaction rate, the reaction between the diimidazolide compound and the diamine compound can be carried out in the presence of an acidic catalyst. Examples of the acidic catalyst include, but are not limited to, solutions of methanesulfonic acid, toluenesulfonic acid, benzenesulfonic acid, dodecylbenzenesulfonic acid, trifluoroacetic acid, acetic acid, sulfuric acid and nitric acid; and solids such as a cation-exchange resin, which is insoluble in the solvent and can also be easily isolated later. The acidic catalyst is preferably added in the amount of 0.001 to 2 mol, more preferably 0.005 to 1 mol, and still more preferably 0.01 to 0.5 mol, based on 1 mol of the diimidazolide compound.

After the completion of the reaction, the reaction solution is allowed to stand at the same temperature or cooled to room temperature to precipitate a reaction product using a proper precipitant, and then the polymer is filtered and dried. The drying temperature is preferably from 40 to 100° C., and more preferably from 50 to 80° C. The polymer is capable of forming a precipitate in water and does not require an alcohol such as ethanol or isopropanol as a precipitant. A satisfactory precipitate can also be obtained by using a mixture of water and the alcohol as the precipitant.

The method of the present invention does not require a complicated purification process of purifying a polymer using an ion exchanger before the drying process, and a chlorine-free high molecular weight alkali-soluble polyamide can be obtained by a simple process.

In the present invention, when excess diamine compound is present relative to the diimidazolide compound, an amino-terminal group of the resultant polyamide can be blocked with a dicarboxylic anhydride before precipitation of the polymer. It is particularly preferred to block with a cis-5-norbornene-endo-2,3-dicarboxylic anhydride.

The polyamide obtained by the method of the present invention can also be used as a resin composition. The resin composition containing the polyamide obtained by the method of the present invention and a solvent can be preferably used as a so-called varnish.

Examples of the solvent include, but are not limited to, N-methylpyrrolidone, tetrahydrofuran, dimethyl sulfoxide, N,N-dimethylacetamide, γ-butyrolactone, propylene glycol monomethyl ether, propylene glycol monomethyl ether acetate, ethyl lactate, diacetone alcohol, 2-heptane, cyclohexanone and cyclopentanone.

The polyamide obtained by the method of the present invention can also be used as a photosensitive resin composition. The resin composition containing the polyamide obtained by the method of the present invention, a photo acid generator and a solvent can be used as a positive photosensitive resin composition (positive photosensitive varnish). Also, the resin composition containing the polyamide obtained by the method of the present invention, a photopolymerizable compound and a solvent can be used as a negative photosensitive resin composition (negative photosensitive varnish).

The photo acid generator includes a quinonediazide compound, a sulfonium salt, a phosphonium salt and a diazonium salt, and is preferably a quinonediazide compound. Examples of the quinonediazide compound include those obtained by ester bonding of a polyhydroxy compound with sulfonic acid of quinonediazide, those obtained by sulfonamide bonding of a polyamino compound with sulfonic acid of quinonediazide, and those obtained by ester bonding and/or sulfonamide bonding of a polyhydroxypolyamino compound with sulfonic acid of quinonediazide. It is preferred that 50 mol % or more of all functional groups of these polyhydroxy and polyamino compounds may be substituted with quinonediazide. Substitution of 50 mol % or more of all functional groups with quinonediazide has such an advantage that solubility in an alkali developing solution is improved and a precise fine pattern with a high contrast with the unexposed portion (solubility contrast between exposed and unexposed portion) can be obtained. It is possible to obtain a positive photosensitive resin composition sensitive to ordinal ultraviolet light such as i-line (365 nm), h-line (405 nm) or g-line (436 nm) from a mercury lamp by using such a quinonediazide compound.

Examples of preferred quinonediazide compound include a 5-naphthoquinone diazide sulfonyl ester compound and a 4-naphthoquinone diazide sulfonyl ester compound. It is possible to use a naphthoquinone diazide sulfonyl ester compound having both 4-naphthoquinone diazide sulfonyl and 5-naphthoquinone diazide sulfonyl groups in the same molecule, and also to use a mixture of the 4-naphthoquinone diazide sulfonyl ester compound and the 5-naphthoquinone diazide sulfonyl ester compound.

The content of the photo acid generator in the photosensitive resin composition of the present invention is preferably 1 part by weight or more and 50 parts by weight or less, and more preferably 3 parts by weight or more and 40 parts by weight or less, based on 100 parts by weight of the polymer. By adjusting the content of the photo acid generator to 1 part by weight or more, it is possible to prevent elution of the unexposed portion during developing to obtain a resin composition having a high residual film thickness after the development. By adjusting the content of the photo acid generator to 50 parts by weight or less, it is possible to suppress deterioration of mechanical properties after curing.

For the purpose of remarkably improving exposure sensitivity, the above positive photosensitive resin composition can contain a phenol resin, a novolak resin or a resol resin. The content of these resins is preferably from 10 to 200 parts by weight, and more preferably from 100 to 170 parts by weight, based on 100 parts by weight of the polyamide of the present invention.

The resin composition of the present invention can also contain a dissolution modifying agent as long as a shrinkage ratio after curing does not decrease (a shrinkage by curing does not increase). It is possible to preferably use, as the dissolution modifying agent, any compound which can be usually used as the dissolution modifying agent in a positive resist, such as a polyhydroxy compound, a sulfonamide compound or a urea compound. In particular, a polyhydroxy compound as a raw material for synthesis of a quinonediazide compound is preferably used.

The photopolymerizable compound has a polymerizable unsaturated functional group. Examples of the polymerizable unsaturated functional group include unsaturated double bond functional groups such as a vinyl group, an allyl group, an acryloyl group and a methacryloyl group and/or unsaturated triple bond functional groups such as propargyl. Of these groups, a group selected from a conjugated vinyl group, an acryloyl group and a methacryloyl group is preferred in view of polymerizability. The number of the functional groups to be contained is preferably 1 to 4 in view of stability, and the respective groups may be the same or different. The photopolymerizable compound as used herein preferably has a molecular weight of 30 to 800. When the molecular weight is within a range from 30 to 800, satisfactory compatibility with the polyamide and satisfactory stability of the resin composition solution are achieved.

Examples of preferred photopolymerizable compound include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, isobornyl methacrylate, cyclohexyl methacrylate, 1,3-butanediol diacrylate, 1,3-butanediol dimethacrylate, neopentylglycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 2-hydroxyethyl acrylate, 2-hydroxyethyl methacrylate, 1,3-diacryloyloxy-2-hydroxypropane, 1,3-dimethacryloyloxy-2-hydroxypropane, methylenebisacrylamide, N,N-dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, N-vinyl pyrrolidone and N-vinyl caprolactam. These photopolymerizable compounds are used alone, or two or more kinds thereof are used in combination.

Of these photopolymerizable compounds, particularly preferred photopolymerizable compounds are 1,9-nonanediol dimethacrylate, 1,10-decanediol dimethacrylate, dimethyloltricyclodecane diacrylate, isobornyl acrylate, isobornyl methacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, methylenebisacrylamide, N,N-dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, N-vinyl pyrrolidone and N-vinylcaprolactam.

The content of the photopolymerizable compound in the photosensitive resin composition of the present invention is preferably adjusted within a range from 5 to 200 parts by weight based on 100 parts by weight of the polymer, and more preferably adjusted within a range from 5 to 150 parts by weight in view of compatibility. By adjusting the content of the photopolymerizable compound to 5 parts by weight or more, it is possible to prevent elution of the exposed portion during developing to obtain a resin composition having a high residual film thickness after the development. By adjusting the content of the photopolymerizable compound to 200 parts by weight or less, whitening of the film upon formation of the film can be suppressed.

The method for forming a pattern will be described as a processing example of the photosensitive resin composition, but applications of the present invention are not limited thereby. First, a resin composition (varnish) is coated on a substrate. Examples of usable substrate include, but are not limited to, wafers made of silicone, ceramics, and gallium arsenide, or these wafers with electrodes and/or wirings made of metallic materials such as copper, gold and titanium-based metal formed thereon. The coating method includes a spin coating method using a spinner, a spray coating method and a roll coating method. Although the thickness of the coating film varies depending on the coating method, and the solid content and viscosity of the composition, coating is usually performed so as to adjust the thickness of the film after drying within a range from 0.1 to 150 μm.

Next, the substrate coated with the resin composition is dried to obtain a pre-dried coating film. Drying is preferably performed at a temperature within a range from 50° C. to 150° C. for 1 minute to several hours using an oven, a hot plate or infrared light. If necessary, drying can also be performed in multi-steps such as two or more steps, for example, drying is performed at 120° C. for 2 minutes after drying at 80° C. for 2 minutes.

Next, the coating film is exposed to chemical light irradiation through a mask having a desired pattern. Although the chemical light used in exposure includes ultraviolet light, visible light, electron beam and X-ray, i-line (365 nm), h-line (405 nm) or g-line (436 nm) from a mercury lamp is preferably used in the present invention.

When the resolution of the pattern increases during developing and the acceptable width of development conditions increases, the process of performing a baking treatment can be included before the development. The temperature of the baking treatment is preferably within a range from 50 to 180° C., and more preferably from 60 to 150° C. The treating time is preferably from 10 seconds to several hours. There is an advantage that the reaction satisfactorily proceeds and also the developing time can be reduced when the treating time is within the above range.

In order to form a pattern, after exposure, the exposed portion is removed by using a developing solution in the case of a positive type, whereas, the unexposed portion is removed by using a developing solution in the case of a negative type. The developing solution is preferably an aqueous solution of an organic compound causing alkalinity, such as an aqueous solution of tetramethylammonium, diethanolamine, diethylaminoethanol, triethylamine, diethylamine, methylamine, dimethylamine, acetic acid dimethylaminoethyl, dimethylaminoethanol, dimethylaminoethyl methacrylate, cyclohexylamine, ethylenediamine or hexamethylenediamine, but is not limited thereto. To these aqueous alkali solutions, organic solvents, for example, polar solvents such as N-methyl-2-pyrrolidone, N,N-dimethylformamide, N,N-dimethylacetamide, dimethyl sulfoxide, γ-butyrolactone and dimethylacrylamide; alcohols such as methanol, ethanol and isopropanol; esters such as ethyl lactate and propylene glycol monomethyl ether acetate; and ketones such ascyclopentanone, cyclohexanone, isobutylketone and methyl isobutyl ketone can be added alone, or a mixture thereof can be added, if necessary. After the development, a rinsing treatment with water is performed. The rinsing treatment can be performed using water containing alcohols such as ethanol and isopropyl alcohol, and esters such as ethyl lactate and propylene glycol monomethyl ether acetate added therein.

After the development, the solvent is removed by subjecting to a heat treatment at a temperature within a range from 160° C. to 500° C. In this case, the intramolecular cyclization reaction of the polyamide is sometimes promoted. This heat treatment is performed for 5 minutes to 5 hours while heating stepwise or continuously. One example is a method of subjecting to a heat treatment at 130° C., 200° C. and 300° C. for each 30 minutes. Another example is a method of linearly heating from room temperature to 300° C. over 2 hours.

The coating film formed from the resin composition of the present invention is suitably used for applications such as passivation films of semiconductors, protective films of semiconductor devices, interlayer insulating films of multilayered wirings for high density mounting, and insulating layers of organic electroluminescence elements.

EXAMPLES

The present invention will be described by way of Examples, but the present invention is not limited to the following Examples. First, a method for evaluation of a polymer will be described.

1) Evaluation of Molecular Weight of Polymer and Remaining of Organic Impurities A polymer was dissolved in N-methyl-2-pyrrolidone (NMP) in the concentration of 0.1% by weight. With respect to this solution, a weight average molecular weight (Mw) was measured by gel permeation chromatography (GPC) under the conditions shown below. Mw of 10,000 or more was rated "Pass", whereas, Mw of less than 10,000 was rated "Fail". Paying attention to the region where the molecular weight is less than 5,000, the presence or absence of a low molecular peak attributed to remaining organic impurities was evaluated. The case where low molecular peak does not exist was rated "Pass", whereas, the case where low molecular peak exists was rated "Fail".

As a mobile phase of a column, a liquid prepared by adding 2.12 g of LiCl and 4.80 g (0.05 mmol/L) of phosphoric acid to 1 L of NMP, stirring with ultrasonic wave for 4 hours or more, and filtering through a membrane filter having a pore opening size of 0.2 µm was used.

A calibration curve using standard polystyrene was made and data were calculated as a polystyrene equivalent relative molecular weight using this curve.

<GPC Measurement System>
Detector: Waters 996
System controller: Waters 2690
Column oven: Waters HTR-B
Thermocontroller: Waters TCM
Column: TOSOH TSK guard column
TOSOH TSK-GEL α-4000
TOSOH TSK-GEL α-2500

2) Evaluation of Remaining Chlorine Impurities of Polymer

A polymer (1 g) was placed in a polyethylene bottle and 100 cm$^3$ of ultrapure water was added, and then an ion component was extracted by standing at room temperature for 36 hours. The ion component was filtered through a disk filter (0.45 µm PVDF, manufactured by Millipore Corporation). With respect to the resultant extract solution, a chlorine component was analyzed by ion chromatography under the conditions shown below to determine the amount of the extract from the sample. The same operation was performed without using the sample to obtain a blank solution. The case where the concentration of the chlorine component is 5 ppm or less was rated "Pass", whereas, the case where the concentration of the chlorine component is more than 5 ppm was rated "Fail".

<Measuring Conditions of Ion Chromatography>
Apparatus: DX500, manufactured by Dionex Corporation
Injection amount of sample: 0.5 mL
Eluent: 2 mM-NaHCO$_3$
Separation column: 4 mmφ×250 mm Ion Pac AS4A-SC
Detector: conductivity meter Synthesis Example 1

In a 250 ml three-necked flask, 27.2 g (0.4 mol) of imidazole was charged under a nitrogen gas flow and dissolved in 100 g of NMP at room temperature under stirring. After cooling to −5° C. or lower, a liquid prepared by dissolving 20.3 g (0.1 mol) of isophthalic acid chloride in 100 g of NMP was added dropwise over 1 hour so that the temperature of the reaction solution does not exceed 0° C. After dropwise addition, the reaction solution was further stirred at room temperature for 3 hours and 1 L of pure water was added, and then the precipitate was filtered. The precipitate obtained by filtration was washed several times with pure water and then dried in a vacuum oven at 50° C. for 100 hours to obtain a diimidazolide compound A represented by the following formula (6).

[Chemical Formula 11]

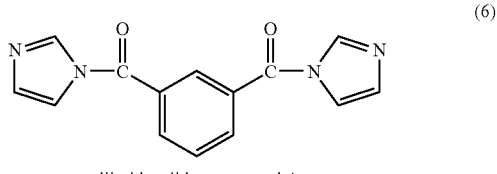

(6)

diimidazolide compound A

Synthesis Example 2

In a 250 ml three-necked flask, 27.2 g (0.4 mol) of imidazole was charged under a nitrogen gas flow and dissolved in 100 g of methylene chloride at room temperature under stirring. After cooling to −5° C. or lower, a dispersion prepared by dispersing 29.5 g (0.1 mol) of 4,4'-diphenyletherdicarboxylic acid dichloride in 100 g of methylene chloride was added dropwise over 1 hour so that the temperature of the reaction solution does not exceed 0° C. After dropwise addition, the reaction solution was further stirred at room temperature for 3 hours and 1 L of pure water was added, and then the precipitate produced during the reaction was filtered. The precipitate obtained by filtration was washed several times with pure water and then dried in a vacuum oven at 50° C. for 100 hours to obtain a diimidazolide compound B represented by the following formula (7).

[Chemical Formula 12]

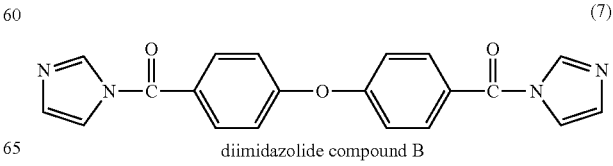

(7)

diimidazolide compound B

Synthesis Example 3

In the same manner as in Synthesis Example 2, except that 29.5 g (0.1 mol) of 4,4'-diphenyletherdicarboxylic acid dichloride was replaced by 34.3 g (0.1 mol) of 4,4'-diphenylsulfonedicarboxylic acid dichloride, a diimidazolide compound C represented by the formula (8) shown below was obtained.

[Chemical Formula 13]

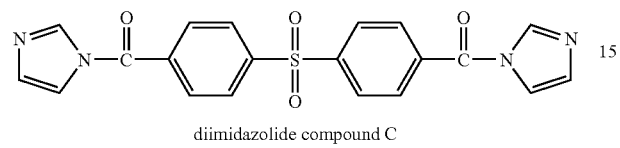

diimidazolide compound C (8)

Synthesis Example 4

In the same manner as in Synthesis Example 2, except that 29.5 g (0.1 mol) of 4,4'-diphenyletherdicarboxylic acid dichloride was replaced by 27.9 g (0.1 mol) of 4,4'-biphenyldicarboxylic acid dichloride, a diimidazolide compound D represented by the formula (9) shown below was obtained.

[Chemical Formula 14]

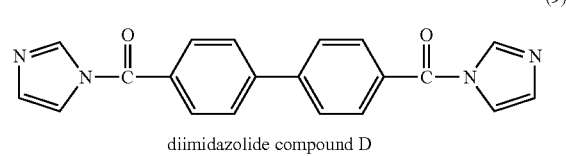

diimidazolide compound D (9)

Example 1

In a 500 mL three-necked flask, 36.6 g (0.1 mol) of the diamine represented by the formula (10) and 300 g of NMP were charged under a nitrogen gas flow and then dissolved at room temperature under stirring. Then, 23.9 g (0.09 mol) of the diimidazolide compound A obtained in Synthesis Example 1 was added at room temperature. This mixture was stirred at 40° C. for 1 hour and then stirred at 50° C. for 10 hours. Furthermore, 3.28 g (0.02 mol) of cis-5-norbornene-endo-2,3-dicarboxylic anhydride was added to this solution, followed by stirring at the same temperature of 50° C. for 10 hours. After the completion of the reaction, the solution was cooled to room temperature and poured into 5 L of pure water. The process of filtering the precipitated polymer and redispersing in 5 L of pure water, followed by filtration was repeated three times. The polymer collected finally by filtration was vacuum-dried at 50° C. for 3 days to obtain a polymer E.

[Chemical Formula 15]

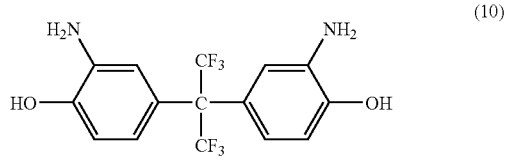

(10)

Example 2

In the same manner as in Example 1, except that 32.2 g (0.09 mol) of the diimidazolide compound B obtained in Synthesis Example 2 was used in place of 23.9 g (0.09 mol) of the diimidazolide compound A, a polymer F was obtained.

Example 3

In the same manner as in Example 1, except that 36.5 g (0.09 mol) of the diimidazolide compound C obtained in Synthesis Example 3 was used in place of 23.9 g (0.09 mol) of the diimidazolide compound A, a polymer G was obtained.

Example 4

In the same manner as in Example 1, except that 30.8 g (0.09 mol) of the diimidazolide compound D obtained in Synthesis Example 4 was used in place of 23.9 g (0.09 mol) of the diimidazolide compound A, a polymer H was obtained.

Example 5

In a 500 mL three-necked flask, 21.6 g (0.1 mol) of diamine represented by the following formula (11) and 300 g of NMP were charged under a nitrogen gas flow and then dissolved at room temperature under stirring. Then, 32.2 g (0.09 mol) of the diimidazolide compound B obtained in Synthesis Example 2 was added at room temperature. This mixture was stirred at 40° C. for 1 hour and then stirred at 50° C. for 10 hours. Furthermore, 3.28 g (0.02 mol) of cis-5-norbornene-endo-2,3-dicarboxylic anhydride was added to this solution, followed by stirring at the same temperature of 50° C. for 10 hours. After the completion of the reaction, the solution was cooled to room temperature and poured into 5 L of pure water. The process of filtering the precipitated polymer by filtration and redispersing in 5 L of pure water, followed by filtration was repeated three times. The polymer collected finally by filtration was vacuum-dried at 50° C. for 3 days to obtain a polymer I.

[Chemical Formula 16]

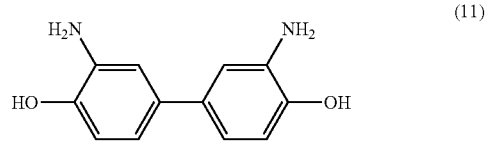

(11)

Example 6

In the same manner as in Example 5, except that 28.0 g (0.1 mol) of the diamine represented by the formula (12) shown below was used in place of 21.6 g (0.1 mol) of the diamine represented by the formula (11) shown above, a polymer J was obtained.

[Chemical Formula 17]

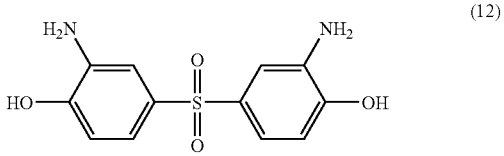

(12)

Example 7

In the same manner as in Example 5, except that 23.2 g (0.1 mol) of the diamine represented by the formula (13) shown below was used in place of 21.6 g (0.1 mol) of the diamine represented by the formula (11) shown above, a polymer K was obtained.

[Chemical Formula 18]

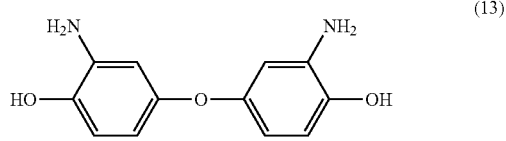
(13)

Example 8

In the same manner as in Example 5, except that 38.0 g (0.1 mol) of the diamine represented by the formula (14) shown below was used in place of 21.6 g (0.1 mol) of the diamine represented by the formula (11) shown above, a polymer L was obtained.

[Chemical Formula 19]

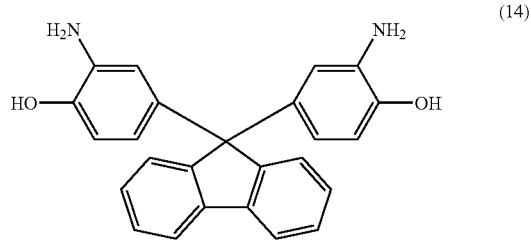
(14)

Comparative Example 1

In the same manner as in Example 5, except that 20.0 g (0.1 mol) of 4,4'-diaminodiphenylether was used in place of 21.6 g (0.1 mol) of the diamine represented by the formula (11) shown above, a polymer M was obtained.

Example 9

In the same manner as in Example 5, except that 12.4 g (0.1 mol) of the diamine represented by the formula (15) shown below was used in place of 21.6 g (0.1 mol) of the diamine represented by the formula (11) shown above, a polymer N was obtained.

[Chemical Formula 20]

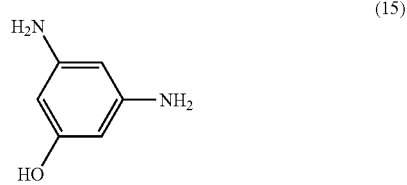
(15)

Example 10

In the same manner as in Example 5, except that 21.6 g (0.1 mol) of the diamine represented by the formula (16) shown below was used in place of 21.6 g (0.1 mol) of the diamine represented by the formula (11) shown above, a polymer N was obtained.

[Chemical Formula 21]

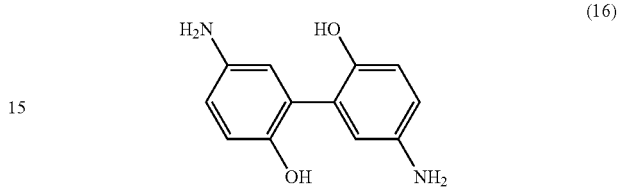
(16)

Comparative Example 2

In a 1,000 ml three-necked flask, a diester (0.1 mol) composed of 40.0 g of isophthalic acid and 1-hydroxybenzotriazole, 36.6 g (0.1 mol) of the diamine represented by the formula (10) shown above and 500 g of NMP were charged under a nitrogen gas flow and then heated to 75° C. while stirring. To the solution thus obtained, a solution prepared by dissolving 1.27 g of dry pyridine (16 mmol) in 10 ml of NMP was slowly added dropwise and this solution was stirred at 75° C. for 24 hours. After cooling to room temperature, the resultant clear yellow reaction solution was filtered and then added to 400 ml of a mixture of 3 parts by volume of water and 1 part by volume of isopropanol. The precipitated white polymer was obtained by filtration and then washed twice with 200 ml of water. The polymer was vacuum-dried at a temperature of 50° C. for 3 days to obtain a polymer P.

Comparative Example 3

In a 250 ml three-necked flask, 36.6 g (0.1 mol) of the diamine represented by the formula (10) shown above and 500 g of NMP were charged under a nitrogen gas flow and then dissolved under stirring. After cooling to −5° C. or lower, a liquid prepared by dissolving 29.5 g (0.1 mol) of 4,4'-diphenyletherdicarboxylic acid chloride in 100 g of NMP was added dropwise over 1 hour so that the temperature of the reaction solution does not exceed 0° C. After dropwise addition, the reaction solution was further stirred at room temperature for 3 hours and poured into 1 L of pure water, and then the precipitate was filtered. The precipitate obtained by filtration was washed several times with pure water and then vacuum-dried at a temperature of 50° C. for 3 days to obtain a polymer Q.

The evaluation results of Examples 1 to 10 and Comparative Examples 1 to 3 were summarized in Table 1.

TABLE 1

|  | Polymer | Molecular weight | Organic impurities | Chlorine concentration (ppm) |
| --- | --- | --- | --- | --- |
| Example 1 | E | 18,000 | not contained | 2 |
| Example 2 | F | 32,000 | not contained | 2 |
| Example 3 | G | 35,000 | not contained | 2 |
| Example 4 | H | 33,000 | not contained | 2 |
| Example 5 | I | 25,000 | not contained | 2 |

TABLE 1-continued

| | Polymer | Molecular weight | Organic impurities | Chlorine concentration (ppm) |
|---|---|---|---|---|
| Example 6 | J | 40,000 | not contained | 2 |
| Example 7 | k | 20,000 | not contained | 2 |
| Example 8 | L | 28,000 | not contained | 2 |
| Example 9 | N | 15,000 | not contained | 2 |
| Example 10 | O | 16,000 | not contained | 2 |
| Comparative Example 1 | M | 8,000 | not contained | 2 |
| Comparative Example 2 | P | 40,000 | contained | 2 |
| Comparative Example 3 | Q | 52,000 | not contained | 50 |

Synthesis Example 5

Synthesis of Quinonediazide Compound (a)

15.3 g (0.05 mol) of TrisP-HAP (trade name, manufactured by Honshu Chemical Industry Co., Ltd.) and 40.3 g (0.15 mol) of 5-naphthoquinone diazide sulfonyl chloride were dissolved in 450 g of 1,4-dioxane under a dry nitrogen gas flow and then the temperature was controlled to room temperature. To this was added dropwise a mixture of 50 g of 1,4-dioxane and 15.2 g of triethylamine so that the temperature in the system does not reach 35° C. or higher. After dropwise addition, the reaction solution was stirred at 30° C. for 2 hours. The triethylamine salt was removed by filtration and the filtrate was poured into water. Then, the precipitate was collected by filtration. This precipitate was dried by a vacuum dryer to obtain a quinonediazide compound (a) represented by the following formula.

[Chemical Formula 22]

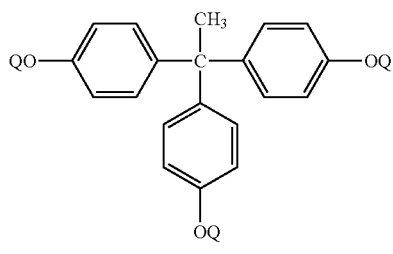

quinonediazide compound (a)

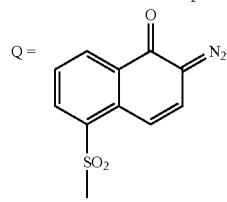

Examples 11 to 20

Comparative Examples 4 to 6

After dissolving 3.5 g of each polymer shown in Table 2 in 6.5 g of γ-butyrolactone, 0.7 g of the quinonediazide compound (a) obtained in Synthesis Example 5, 0.1 g of KBM-1003 (manufactured by Shin-Etsu Chemical Co., Ltd.) and 0.2 g of a 0.5% ethyl lactate solution of POLYFLOW No. 77 (manufactured by KYOEISHA CHEMICAL Co., LTD.) were added to obtain a photosensitive varnish. This varnish was spin-coated on a 6 inch wafer and then treated on a hot plate (manufactured by Tokyo Electron Limited, MARK-7) at 120° C. for 3 minutes to obtain a 7 μm thick coating film. This coating film was exposed in a dose within range from 0 mJ/cm² to 1,000 mJ/cm² by every 100 mJ/cm² using an i-line stepper (DSW-8000, manufactured by GCA Corporation), followed by exposure, development with a 2.38% aqueous solution of tetramethylammonium hydroxide (TMAH) for 100 seconds and further rising with pure water to obtain a desired pattern. At this time, the smallest light exposure at which a 10 μm square pattern is formed was regarded as sensitivity and shown in Table 2. Sensitivity of 1,000 mJ/cm² or less was rated "Pass", whereas, sensitivity of 1,000 mJ/cm² or more was rated "Fail".

Examples 21 to 23

Comparative Examples 7 to 9

After dissolving 3.5 g of each polymer shown in Table 2 in 6.5 g of γ-butyrolactone, 0.5 g of DCP-A (manufactured by KYOWA HAKKO Co., Ltd.) as a photopolymerizable compound, 1.0 g of PDBE-250 (manufactured by NOF CORPORATION) as the same photopolymerizable compound, 0.5 g of MOI-BP (manufactured by Showa Denko K.K.) as the same photopolymerizable compound, 0.5 g of OXE-02 (manufactured by Ciba Specialty Chemicals) as a photopolymerization initiator, 0.1 g of KBM-573 (manufactured by Shin-Etsu Chemical Co., Ltd.) and a 0.5% γ-butyrolactone solution of 0.2 g of POLYFLOW No. 77 (manufactured by KYOEISHA CHEMICAL Co., LTD.) were added to obtain a photosensitive varnish. This varnish was spin-coated on a 6 inch wafer and then treated on a hot plate (manufactured by Tokyo Electron Limited, MARK-7) at 120° C. for 3 minutes to obtain a 7 μm thick coating film. This coating film was exposed in a dose within range from 0 mJ/cm² to 1,000 mJ/cm² by every 100 mJ/cm² using an i-line stepper (DSW-8000, manufactured by GCA Corporation) and then treated on a hot plate (manufactured by Tokyo Electron Limited, MARK-7) at 120° C. for 1 minute. Subsequently, development with a 2.38% aqueous solution of tetramethylammonium hydroxide (TMAH) for 60 seconds and further rising with pure water were performed to obtain a desired pattern. At this time, the smallest light exposure at which a 30 μm square pattern is formed and also the pattern has not an inverse tapered shape was regarded as sensitivity and shown in Table 2. Sensitivity of 1,000 mJ/cm² or less was rated "Pass", whereas, sensitivity of 1,000 mJ/cm² or more was rated "Fail".

Example 24

In the same manner as in Examples 11 to 20, except that 1.4 g of the polymer F and 2.1 g of a novolak resin compound PSF-2808 (manufactured by Gunei Chemical Industry Co., Ltd.) were used as the polymer, a photosensitive varnish was produced. The results are shown in Table 2.

TABLE 2

| | Polymer | Sensitivity (mJ/cm²) |
|---|---|---|
| Example 11 | E | 500 |
| Example 12 | F | 250 |
| Example 13 | G | 400 |
| Example 14 | H | 400 |
| Example 15 | I | 500 |
| Example 16 | J | 250 |
| Example 17 | K | 400 |
| Example 18 | L | 300 |

TABLE 2-continued

| | Polymer | Sensitivity (mJ/cm²) |
|---|---|---|
| Example 19 | N | 700 |
| Example 20 | O | 600 |
| Example 21 | E | 800 |
| Example 22 | F | 500 |
| Example 23 | J | 500 |
| Example 24 | F | 150 |
| Comparative Example 4 | M | >1000 |
| Comparative Example 5 | P | 250 |
| Comparative Example 6 | Q | 250 |
| Comparative Example 7 | M | >1000 |
| Comparative Example 8 | P | 600 |
| Comparative Example 9 | Q | 600 |

INDUSTRIAL APPLICABILITY

According to the present invention, it is possible to obtain high molecular weight polyamide which is chlorine free, and is also soluble in an organic alkaline developer. A coating film formed from a resin composition containing the polyamide obtained by the method of the present invention is suitably used in applications such as passivation films of semiconductors, protective films of semiconductor devices, interlayer insulating films of multilayered wirings for high density mounting, and insulating layers of organic electroluminescence elements.

The invention claimed is:

1. A method for producing polyamide comprising:
dissolving a diamine compound represented by a general formula (2) shown below in an organic solvent,
subsequently dissolving a diimidazolide compound represented by a general formula (1) shown below in a solution containing the diamine compound in the organic solvent, reacting the diimidazolide compound with the diamine compound, and precipitating a reaction product using water:
the general formula (1) being

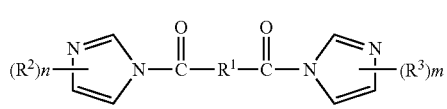
(1)

wherein $R^1$ represents a divalent organic group having 6 or more carbon atoms, $R^2$ and $R^3$ represent a monovalent organic group having 1 to 3 carbon atoms, and n and m represent an integer of 0 to 2, and
the general formula (2) being

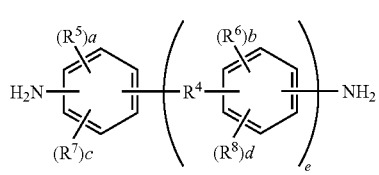
(2)

wherein $R^4$ represents a single bond, $SO_2$, an oxygen atom, a sulfur atom or a divalent organic group having 1 to 30 carbon atoms, $R^5$ and $R^6$ represent an OH group at the ortho-position relative to an amino group, $R^7$ and $R^8$ represent a monovalent organic group having 1 to 10 carbon atoms, a represents 1, b represents 1, c and d represent an integer of 0 to 3, and e represents an integer of 0 to 3.

2. The method for producing polyamide according to claim 1,
wherein the diimidazolide compound is represented by a general formula (3): the general formula (3) being

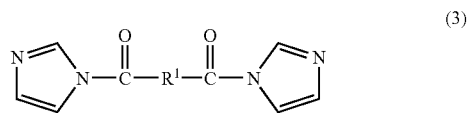
(3)

wherein $R^1$ represents a divalent organic group having 6 or more carbon atoms.

3. The method for producing polyamide according to claim 1, wherein the diimidazolide compound is represented by a general formula (4):
the general formula (4) being

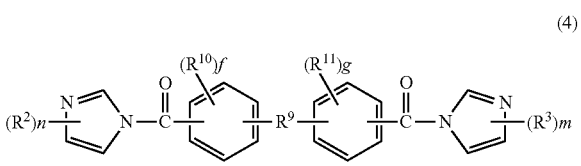
(4)

wherein $R^9$ represents a single bond, $CH_2$, $SO_2$, an oxygen atom, a sulfur atom, $C(CH_3)_2$, $C(CF_3)_2$ or a residue of a fluorene structure, $R^{10}$ and $R^{11}$ represent OH, SH or a monovalent organic group having 1 to 10 carbon atoms, f and g represent an integer of 0 to 4, $R^2$ and $R^3$ represent a monovalent organic group having 1 to 3 carbon atoms, and n and m represent an integer of 0 to 2.

4. The method for producing polyamide according to claim 3, wherein the diimidazolide compound is represented by a general formula (5):
the general formula (5) being

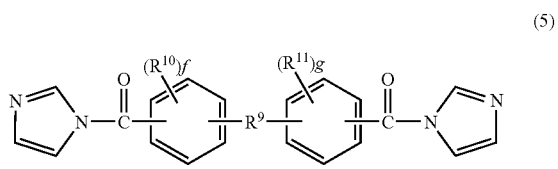
(5)

wherein $R^9$ represents a single bond, $CH_2$, $SO_2$, an oxygen atom, a sulfur atom, $C(CH_3)_2$, $C(CF_3)_2$ or a residue of a fluorene structure, $R^{10}$ and $R^{11}$ represent OH, SH or a monovalent organic group having 1 to 10 carbon atoms, and f and g represent an integer of 0 to 4.

5. The method for producing polyamide according to claim 1, wherein e=1 in the general formula (2).

6. The method for producing polyamide according to claim 3, wherein $R^9$ is an oxygen atom in the general formula (4).

7. The method of claim 1, wherein the polyamide is a chlorine-free polyamide.

* * * * *